(12) United States Patent (10) Patent No.: US 8,773,637 B2
Van De Kerkhof et al. (45) Date of Patent: Jul. 8, 2014

(54) LITHOGRAPHIC APPARATUS AND DEVICE MANUFACTURING METHOD OF APPLYING A PATTERN TO A SUBSTRATE USING SENSOR AND ALIGNMENT MARK

(75) Inventors: Marcus Adrianus Van De Kerkhof, Helmond (NL); Willem Jurrianus Venema, Eindhoven (NL); Bearrach Moest, Eindhoven (NL); Vasco Miguel Matias Serrao, Hasselt (PT); Cedran Bomhof, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 496 days.

(21) Appl. No.: 12/908,564

(22) Filed: Oct. 20, 2010

(65) Prior Publication Data

US 2011/0090476 A1 Apr. 21, 2011

Related U.S. Application Data

(60) Provisional application No. 61/253,630, filed on Oct. 21, 2009.

(51) Int. Cl.
*G03B 27/52* (2006.01)
*G03F 9/00* (2006.01)

(52) U.S. Cl.
CPC ............ *G03F 9/7088* (2013.01); *G03F 9/7026* (2013.01)
USPC .......................................................... 355/55

(58) Field of Classification Search
CPC .............................. G03F 9/7088; G03F 9/7026
USPC ...................................................... 355/55, 53
See application file for complete search history.

(56) References Cited

U.S. PATENT DOCUMENTS 7,409,302 B2 8/2008 Kok et al.
2003/0133088 A1 7/2003 Okita et al.
(Continued)

FOREIGN PATENT DOCUMENTS

JP 5-160000 6/1993
JP 5-182887 7/1993
(Continued)

OTHER PUBLICATIONS

Japanese Office Action mailed May 14, 2012 in corresponding Japanese Patent Application No. 2010-231036.
(Continued)

*Primary Examiner* — Chia-how Michael Liu
(74) *Attorney, Agent, or Firm* — Pillsbury Winthrop Shaw Pittman LLP

(57) ABSTRACT

A lithographic apparatus includes at least one image alignment sensor for receiving radiation projected from an alignment mark on a reticle. Processor processes signals from the sensor(s) to resolve spatial information in the projected alignment mark to establish a reference for measuring positional relationships between a substrate support and the patterning location. Examples of the sensor include line arrays of photodetectors. A single array can resolve spatial information in a plane of the sensor (X, Y direction) and in a perpendicular (Z) direction. At least a final step in establishing the reference position is performed while holding the substrate support stationary. Errors and delays induced by mechanical scanning of prior art sensors are avoided. Alternatively (not illustrated) the sensor is moved for mechanical scanning relative to the substrate support, independently of the main positioning systems.

16 Claims, 14 Drawing Sheets

(56) References Cited

U.S. PATENT DOCUMENTS

2004/0232313 A1 11/2004 Ye et al.
2006/0061746 A1 3/2006 Kok et al.
2008/0309899 A1* 12/2008 Baselmans et al. ............. 355/52

FOREIGN PATENT DOCUMENTS

| JP | 8-219711 | 8/1996 |
| JP | 2006-242722 | 9/2006 |
| WO | 03/028360 | 4/2003 |

OTHER PUBLICATIONS

Taiwan Office Action dated Jul. 19, 2013 in corresponding Taiwan Patent Application No. 099135486.

Japanese Office Action mailed Jul. 29, 2013 in corresponding Japanese Patent Application No. 2010-231036.

* cited by examiner (a)

(b)                                (c)

(a)

(b) (c)

LITHOGRAPHIC APPARATUS AND DEVICE MANUFACTURING METHOD OF APPLYING A PATTERN TO A SUBSTRATE USING SENSOR AND ALIGNMENT MARK

CROSS REFERENCE TO RELATED APPLICATIONS

This application claims priority and benefit under 35 U.S.C. §119(e) to U.S. Provisional Patent Application No. 61/253,630, entitled "Lithographic Apparatus, Device Manufacturing Method, and Method Of Applying A Pattern To A Substrate", filed on Oct. 21, 2009. The content of that application is incorporated herein in its entirety by reference.

FIELD

The present invention relates to a lithographic apparatus and a method for manufacturing a device. The invention further relates to a method of applying a pattern from a patterning device onto a substrate, and to a computer program product for controlling a lithographic apparatus to implement steps of such methods. The invention is particularly concerned with the process and apparatus for aligning a substrate table accurately with respect to a projected image of alignment marks on the patterning device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay must be achieved within a few tens of nanometers in today's sub-micron semiconductor devices, down to a few nanometers in the most critical layers.

Consequently, modern lithography apparatuses involve extensive measurement operations prior to the step of actually exposing or otherwise patterning the substrate at a target location. These operations, being time-consuming, limit the throughput of the lithography apparatus, and consequently increase the unit cost of the semiconductor or other products. Various steps have been taken to mitigate these delays in the prior art. For example, an arrangement provides dual wafer tables, so that two wafers can be loaded in the machine simultaneously. While a first wafer is undergoing exposure in an exposure station, a second wafer is undergoing measurement processes to establish an accurate 'wafer grid' and height map. The apparatus is designed so that the tables can be swapped without invalidating the measurement results, thereby reducing the overall cycle time per wafer. Other techniques to process measurement and exposure steps in parallel may be employed as well.

One measurement task, which is typically used as a datum for interpreting many other measurements, is the image alignment measurement, by which a pattern projected by the patterning device itself is picked up by sensors coupled, directly or indirectly, to the substrate support. These sensors, in combination with sensors measuring relative positional movements of the substrate table in three dimensions, provide the datum levels by which other measurements can be used to place a desired portion of the substrate accurately in X and Y directions, and also in a Z (focus) direction. The accuracy and repeatability of these datum levels, whether individually or in statistical combinations of multiple measurements, is a limiting factor of the overall accuracy of patterning location and focus.

Known image alignment sensors comprise sensors fixed in relation to the substrate table (fixed at least for a duration of the image alignment measurement). The positioning subsystem for the substrate table is used to move the table so as to scan the sensor in X, Y and Z directions through the projected radiation field. By interpreting the measured intensity of the sensor signals at various values of X, Y and Z, the actual position of the projected image can be derived in terms of the appropriate coordinate system of the positioning subsystem.

In seeking to increase the accuracy of such a system, various obstacles are encountered. Firstly, the scanning motion for image alignment inevitably induces vibrations, and therefore inaccuracies in the image alignment result. To reduce the vibrations by reducing the speed of scanning would delay the measurement, and could impact overall productivity (throughput). Moreover, the positioning subsystem for the wafer table is not optimized for the image alignment scanning operation, but rather for the exposure operation. The resulting positioning inaccuracies during the image alignment scan can result in uneven sampling of the projected image.

While these errors have been within tolerances for present generations, any source of error will become significant as manufacturers strive toward the goal of reaching ever-higher levels of positional accuracy. Speed of measurement is also key to improving throughput, while cost of the apparatus is also a factor.

SUMMARY

It is desirable therefore to mitigate further the measurement overhead and/or measurement and positioning errors in lithographic apparatus. A particular desire is to improve the performance and/or speed of the projected image measurement.

According to an aspect of the invention, there is provided a lithographic apparatus arranged to project a pattern from a patterning device onto a substrate, the apparatus comprising:

a patterning subsystem for receiving said patterning device and projecting said pattern to a substrate held at a patterning location;

a substrate support for holding the substrate while said pattern is applied;

at least one positioning subsystem for moving said substrate support, said patterning subsystem and said patterning device relative to each other such that said pattern is applied at an accurately known location on the substrate; and a measuring subsystem for measuring the location of said substrate relative to the patterning location, and for supplying measurement results to said positioning subsystem, wherein said measuring subsystem includes at least one sensor for receiving radiation projected from an alignment mark, the sensor and alignment mark being associated one with the patterning device and the other with the substrate support, the processor, and a processor for receiving and processing signals from the sensor(s) to resolve spatial information in the projected alignment mark to establish a reference for measuring positional relationships between said substrate support and said patterning location, and wherein the sensor and the processor are operable to perform at least a final step in establishing the reference position while holding the substrate support and patterning device stationary with respect to one another.

One option for implementing the apparatus according to this aspect of the invention is to provide separate actuators for moving the sensor relative to the substrate support or the patterning device.

According to other embodiments, said sensor comprises an array of photodetector elements separated in at least one dimension, and a signal processor for calculating said reference position accurately in at least one dimension by combining signals representing radiation intensities measured by the individual elements of the array when the projected alignment mark falls on the array.

According to some embodiments the processor is arranged to distinguish between different elements in accordance with respectively different optical path lengths from the alignment mark, thereby to calculate a reference position in a dimension (Z) parallel to an optical axis of the projection system. In the case of optical lithography, the alignment mark may be projected to the sensor (S) using the same projection system and the same illumination as projects the product pattern present on the patterning device. This approach, although strictly optional, is convenient and brings accuracy and simplicity to the measurement calculations, but other implementations are feasible.

In the case of imprint lithography, the product pattern is applied more directly and is not projected optically. Nevertheless an optical projection of the alignment mark may still be deployed between the patterning device, or its supporting structure, and the substrate or its supporting structure. In principle, embodiments of the invention applied to imprint lithography may involve a sensor on the patterning device and marks projected from the substrate support or an associated element, to the sensor.

While direct projection between alignment mark and the sensor is illustrated and described in the embodiments that follow, modifications are envisaged in which for some reason the projection of the alignment mark is reflected at one or other of the substrate support and the patterning device or its support, and the sensor and alignment mark are both at the same side of the projecting optical system.

According to another aspect of the invention, there is provided a device manufacturing method comprising projecting a pattern from a patterning device onto a substrate, the method comprising:

providing a patterning subsystem for receiving said patterning device and applying said pattern to a portion of said substrate held at a patterning location;

holding the substrate on a substrate support;

measuring the location of said substrate relative to the patterning location;

operating said patterning subsystem while using results of said measuring step to position said substrate support, said patterning subsystem and said patterning device relative to each other in a sequence of movements such that said pattern is applied at a plurality of desired portions of the substrate; and processing said substrate to create product features in accordance with the applied pattern, wherein said measuring step includes a preliminary step of (i) receiving radiation projected from an alignment mark using a sensor and (ii) processing signals from the sensor to resolve spatial information in the projected alignment mark to establish a reference for measuring positional relationships between said substrate support and said patterning location in at least one dimension, and wherein the sensor and the measuring subsystem are arranged to perform at least a final step in establishing the said reference position while the substrate support and patterning device are held stationary with respect to one another.

According to an aspect of the invention, there is provided a computer program product containing one or more sequences of machine-readable instructions for controlling a lithographic apparatus, the instructions being adapted for controlling the measurement and positioning steps of a method as set forth in any of the aspects of the invention above.

These and other features and advantages of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figure 1:
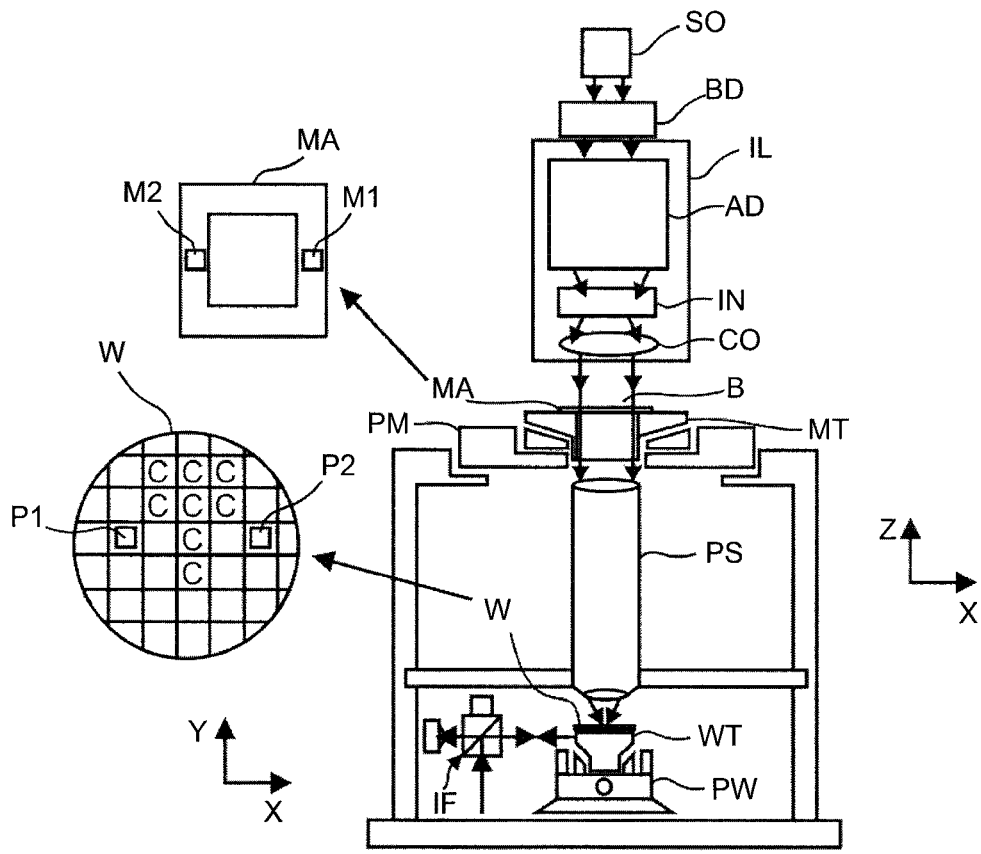
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein is applicable in both single- and multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
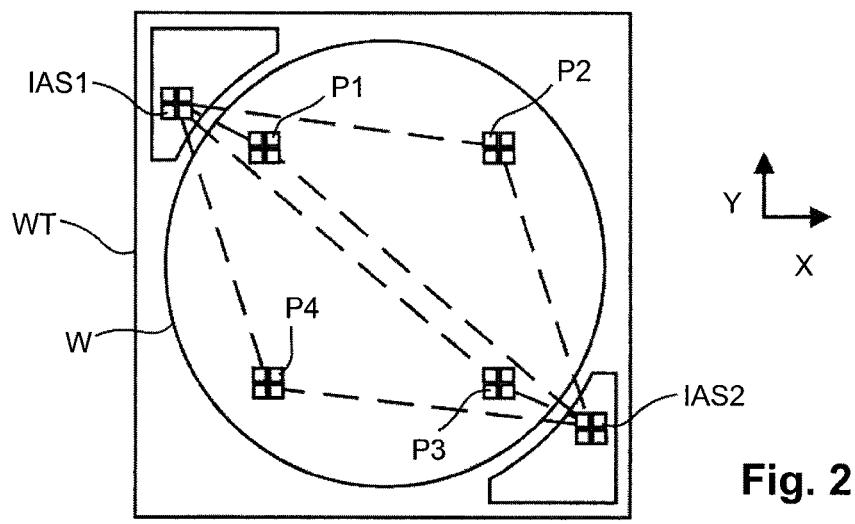
FIG. 2 is a schematic plan view of a substrate table and substrate in the apparatus of FIG. 1, showing alignment marks and sensors useful in one embodiment of the invention.

FIG. 2 schematically depicts an arrangement of the substrate table WT depicted in the lithographic apparatus of FIG. 1, in which the substrate table WT is provided with an embodiment of the image sensor according to the invention. In the substrate table WT, two image sensors IAS1 and IAS2 are provided. The image sensors can be used to determine a location of an aerial image of a pattern, e.g. an object mark, on the mask MA by scanning the image sensor IAS1 or IAS2 through the "aerial image" of the marks, as described below. Alignment marks P1 to P4 are distributed also on the substrate itself.

The term "aerial image" is used in this context to refer to the patterned radiation field which would form a real image, were a substrate or other target present. Features of this field have positions and extents in the X and Y direction according to the pattern and resolving powers of the projection system, and have a height and vertical extent according to the focus position and depth of focus of the projection system. The purpose of the entire process is to position the aerial image of the device pattern accurately in X, Y and Z directions, during the exposure of device patterns in a resist layer or other target.

Figure 3A:
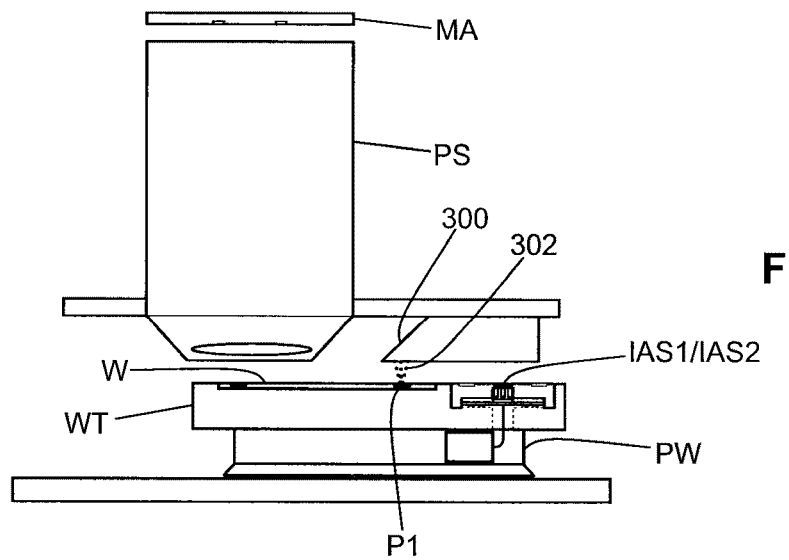
FIGS. 3A to 3C show steps in a known alignment process using the substrate table of FIG. 2.
Figure 3B:
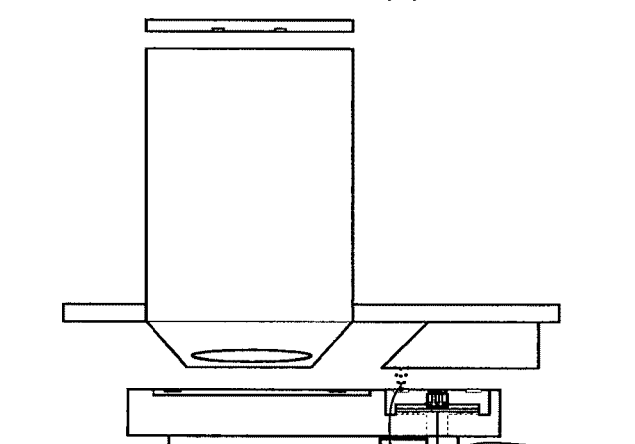
Figure 3C:
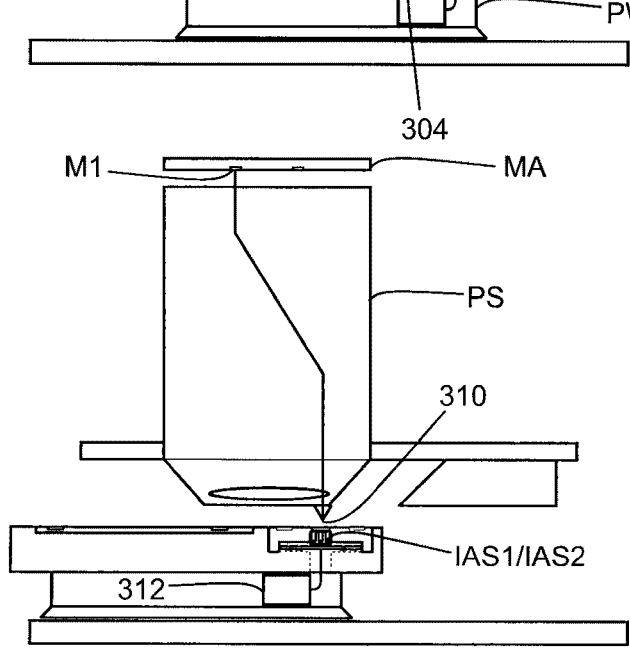

FIGS. 3A to 3C illustrate steps in the alignment process using the image alignment sensors IAS1, IAS2. In addition to the parts generally labeled the same as in FIG. 1 and FIG. 2, an alignment sensor 300 is provided to direct an alignment radiation beam 302 in the direction of the substrate W and/or substrate table WT. At the stage of operation shown in FIG. 3A sensor 300 detects the properties of the beam 302 when reflected, in order to detect alignment of the sensor 300 to patterns such as P1-P4 on the substrate. As shown in FIG. 3B, movement of the substrate table WT, which is measured accurately by sensor IF (shown in FIG. 1) can bring alignment of the radiation beam 302 to bear also on alignment mark 304 on the substrate table. Mark 304 is accurately placed relative to image sensor IAS1, IAS2 etc., for example being a mark on the same block as houses the sensor. Additionally, as shown in FIG. 3C, substrate table WT can be moved to bring image sensor IAS1, IAS2 etc. into the position of an aerial image 310, which is the projection through projection system PS of a mark such as mark M1 on the mask MA. Electronic system 312 detects properties of this aerial image 310, as it is received by sensors IAS1, IAS2, during translational movements of the substrate table WT, to locate in all degrees of freedom the exact location where the mask alignment mark M1 projects with optimum alignment (X-Y) and optimum focus (Z) onto the sensor IAS1.

By way of the image sensors IAS1 and IAS2, when their position in the substrate table is well-known, the relative position of the aerial image of the pattern on the mask MA with respect to the substrate table WT can be determined. The substrate table WT may be provided with a substrate W comprising substrate marks, e.g. substrate marks P1, P2, P3, P4 as depicted in FIG. 2. Alignment sensor 302, in co-operation with position sensor IF, can obtain relative positions of the substrate marks P1, P2, P3, P4. The knowledge of the relative positions of the substrate marks P1, P2, P3, P4 can be obtained by the alignment sensor steps illustrated in FIGS. 3A and 3B. The relative position of the image of the object mark on the mask MA with respect to the wafer table WT can be deduced from information obtained in a preliminary step with the image sensors IAS1, IAS2, (FIG. 3C). These data allow the substrate W to be positioned at any desired position relative to the projected image of the mask MA with great accuracy.

It must be understood that instead of two image sensors IAS1 and IAS2, more or fewer image sensors may be present, e.g. one or three. The form of these sensors and associated electronics is known to the skilled person and will not be described in detail. Alternative forms of alignment mechanism are possible, and useful within the scope of the present invention. Image alignment sensors IAS1, IAS2, may be mounted on a support separate from the table WT which carries the substrate, provided that their relative position can be determined.

Figure 4:
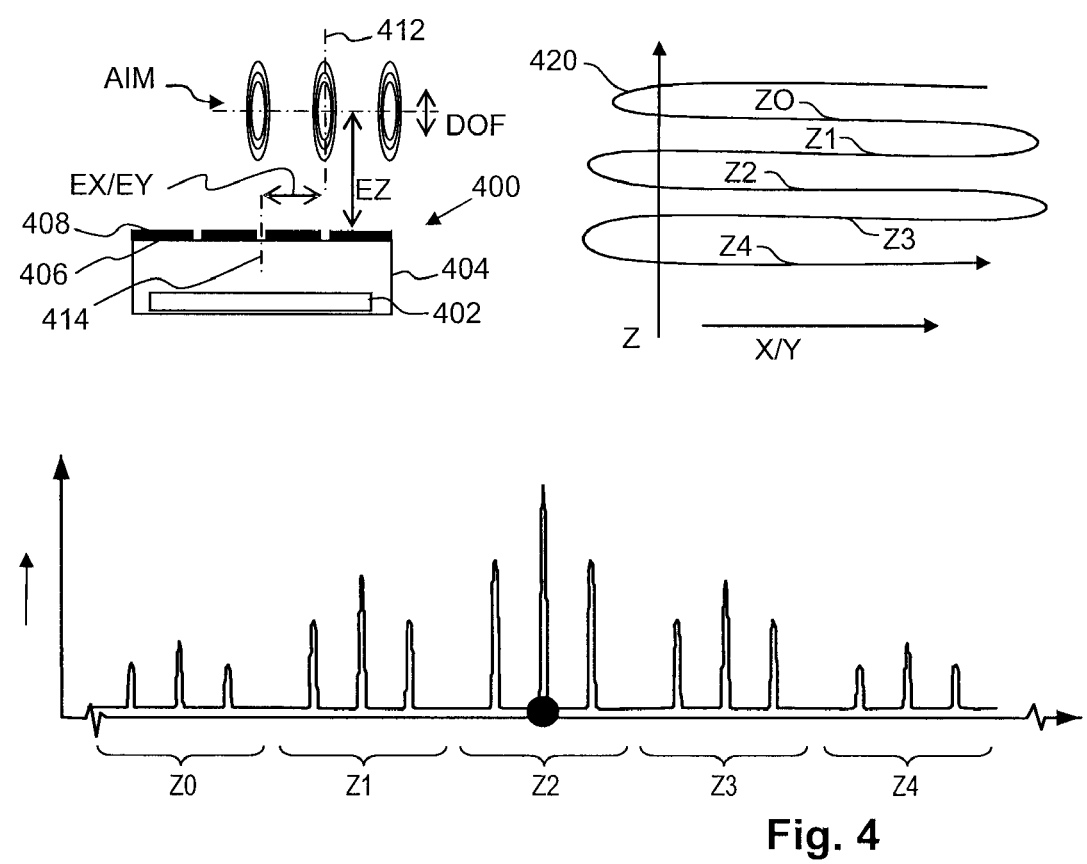
FIG. 4 illustrates the principle of operation of an image alignment sensor in the step illustrated in FIG. 3C.

FIG. 4 illustrates the principles of operation of the image alignment sensors IAS1 and IAS2, in the known apparatus described above. In the known apparatus, mask alignment mark M1 comprises sets of bright lines in the illumination pattern, some of them running in the X direction and thereby yielding Y position information, others running in the Y direction and yielding X position information. In the examples that follow, only the detail of measurement in one of these directions will be described, it being understood that the other direction can be measured likewise. Sensors for both X and Y directions can be combined in one unit, and the marks can, in principle, be combined. Sets of marks at 45 degrees could be envisaged to derive mixed X and Y signals.

For simplicity, however, it is expected that X and Y directions will be processed side-by-side, either sequentially or in parallel. It should further be understood that a practical embodiment will involve process steps for (i) bringing the sensor to the general location of the projected mark, (ii) performing one or more coarse alignment measurements, and (iii) finally obtaining the fine measurement. Different steps and processes, and/or different portions of the sensor and/or marks can be used in these different stages. For the sake of illustration, FIG. 4 illustrates in fact a coarse alignment step (ii) in the known apparatus, while the embodiments of the invention described with reference to FIG. 5 onwards concern especially the fine measurements step, where the problem of accuracy is actually most acute.

AIM in FIG. 4 indicates generally the "aerial image" of three bright lines focused at a point in space with a depth of focus DOF on either side of a nominal Z position (the Z direction being the vertical direction in the diagram). The horizontal axis in the diagram can be regarded as X or Y, as mentioned. The notation X/Y will be used hereafter. The bright lines are represented in cross section by three ellipses, and have a known spacing. The image alignment sensor 400 comprises a photodetector 402, housed in a body 404 (block or cavity) into which radiation from the patterned radiation beam can enter through apertures 406. In this specific example the apertures 406 are three in number, and they are spaced to correspond with the spacing of the three bright lines in the aerial image of the mask alignment mark. The apertures may be defined, for example, by deposition of opaque material, for example a chrome metal layer 408. In the known sensor, a single photo diode 402 can receive and effectively integrate the radiation received through all three apertures, and along a line length extending in the Y or X direction into the diagram.

The vertical (Z) position of the apertures and the Z position of the aerial image AIM are spaced apart by a distance EZ, which represents the "error" in a Z direction. Similarly, a plane 412 through the centre of the central bright line is spaced from a plane 414 through the centre of the central one of the apertures 406 by an X/Y direction error, EX/EY. As will be appreciated, the light entering body 404, and hence the light intensity output by photodetector 402, will be at a maximum when the three bright lines of the aerial image are maximally aligned with and focused on the apertures 406 in the sensor 400, that is, when EZ and EX/EY are both zero. At the right hand side of the diagram, there is indicated schematically a scan path 420, extending horizontally in the X/Y direction, and extending by multiple passes also in the Z direction. The passes are labeled Z0, Z1, Z2 etc., and are made by moving the substrate table WT, on which the sensor 400 is fixedly mounted or to which it is fixedly coupled.

The graph at the lower part of FIG. 4 is a plot of intensity versus time, as measured by photodetector 402. The periods of time corresponding to scans Z0-Z4 are marked along the bottom axis. Within each of these passes, three distinct peaks of intensity can be seen, two weaker peaks on either side of a central, strongest peak. In each pass, weaker peaks arise when one or (in this case) two of the bright lines are aligned with two of the apertures 406 in the sensor 400. Such a situation corresponds approximately to the off-set situation illustrated at top left in FIG. 4. The strongest, central peak in each pass corresponds to the EX/EY=0 position, in which three bright lines are aligned with three apertures, allowing a maximum amount of radiation to impinge on photodetector 402. Among different passes, it can be seen that the intensity peaks corresponding to pass Z2 are the highest. Accordingly, by simple signal processing the position indicated by the spot on the graph axis and the depth value Z2 can be identified as the position with optimum alignment in both the X/Y and Z (focus) directions. By plotting a curve of the highest peak across different Z values, a refined Z position between the scans can in principle be deduced.

By correlating the positions of this highest central peak with movement signals received from the positioning sub-system which drives the substrate table WT, a datum can be established, by which, in principle, any position of the substrate table and substrate W can be achieved with respect to the aerial image of the patterning device.

Naturally, this datum can only be used in conjunction with many other measurements to achieve the required accuracy of patterning on a substrate. On the other hand, any inaccuracies of the datum positions will undermine the accuracy of the entire process. In a practical system, after the process illustrated in the graphs of FIG. 4, a further, fine scanning process will be undertaken to identify exactly the positions in X/Y and Z, to the accuracy required for the exposure of device patterns of the substrate. As mentioned in the introduction, the motors and servo controllers which comprise the positioning sub-system PW are not optimized for this type of scanning, but rather are optimized for the exposure process which follows. Accordingly, errors are likely to arise in the fine scanning process, which cannot be eliminated and may limit the accuracy of the datum for subsequent measurements. The image alignment scanning process takes time, and this conflicts with throughput requirements.

A number of proposals are made herein to address these sources of error and delay. One type of solution which may be considered is to achieve the scanning of the image alignment sensors by actuators and/or servo systems independent of the substrate table WT itself. Accordingly, rather than being fixedly mounted to the substrate table, one may envisage sensor 400 and the like being mounted on a sub-table, driven in X/Y and/or in Z directions by, for example, voice coil or piezo-electric motors. Photodetector 402 might remain static, while the opaque layer 408 with apertures 406 only is moved from side to side and/or vertically. Combinations of such approaches may also be envisaged.

Some drawbacks with such proposals include the additional weight of the motors, position encoders and servo electronics necessary, as well as their inherent complexity and cost. Accordingly, in the embodiments of the invention which are described below, an alternative approach is taken in which the image alignment sensor includes photodetectors and apertures which are entirely static in respect to the substrate table WT, but are sub-divided in X/Y and/or in Z directions, to eliminate entirely the need for scanning movement, at least at the fine measurement state. The sensors may be described as 'self-scanning', though in fact scanning is not a part of their operation, at least in the mechanical sense.

Static Image Alignment Sensor

Figure 5:
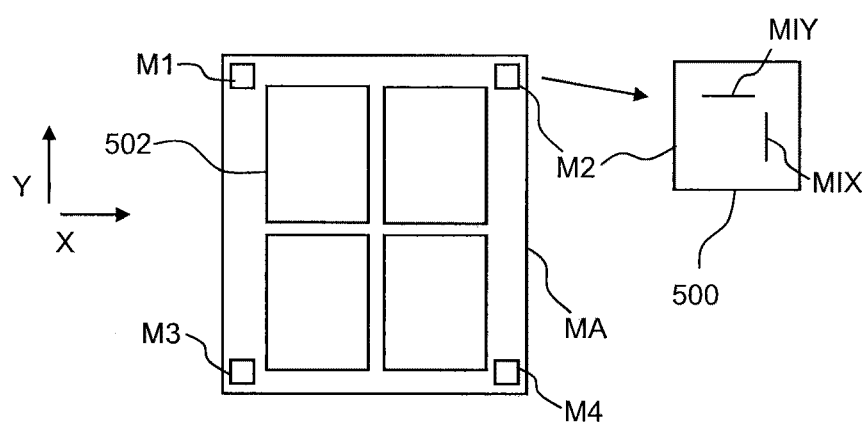
FIG. 5 illustrates the arrangement and structure of novel image alignment marks on a patterning device for use in accordance with one embodiment of the present invention.

FIG. 5 illustrates a patterning device (reticle) MA having, for the sake of example, mask alignment marks M1-M4 placed in its four corners, outside the device pattern areas 502. An enlarged view of mark M2, still highly schematic, is labeled 500. This mark includes a number of bright line features extending, some in the X direction and some in the Y direction. These are labeled MIY and MIX respectively, to reflect that lines MIX, aligned with the Y axis, provide X position information. Although only a single line is illustrated, various forms of mark including lines and/or gratings may be envisaged, as will be further explained below.

Figure 6:
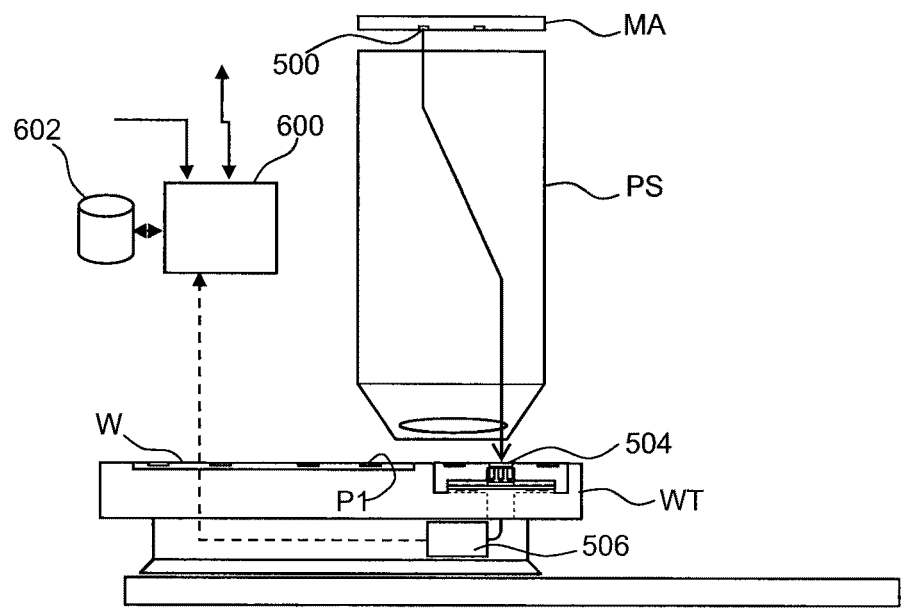
FIG. 6 illustrates the modified apparatus with a novel image alignment sensor according to various embodiments of the present invention.

FIG. 6 illustrates a modified apparatus, which is presented as only a simple modification of the apparatus illustrated in FIGS. 1-3C. The modification comprises a modified mask alignment mark 500 (of the type shown in FIG. 5) and a modified image alignment sensor 504, in place of sensor IAS1/IAS2/400, described above. Sensor 504 is still mounted statically on the substrate table WT, and with a position accurately known and/or measurable with respect to marks P1 etc on the substrate W itself. Modified signal processing circuitry 506 is indicated, together with its connection to a further digital signal processor or computer 600, having associated storage 602 and other connections. The division of tasks between the local signal processing circuitry 506 and computer 600 is a matter of design choice with regard to performance and cost requirements, as well as issues of weight, mass and heat load on the moving table WT.

First Embodiment

Figure 7:
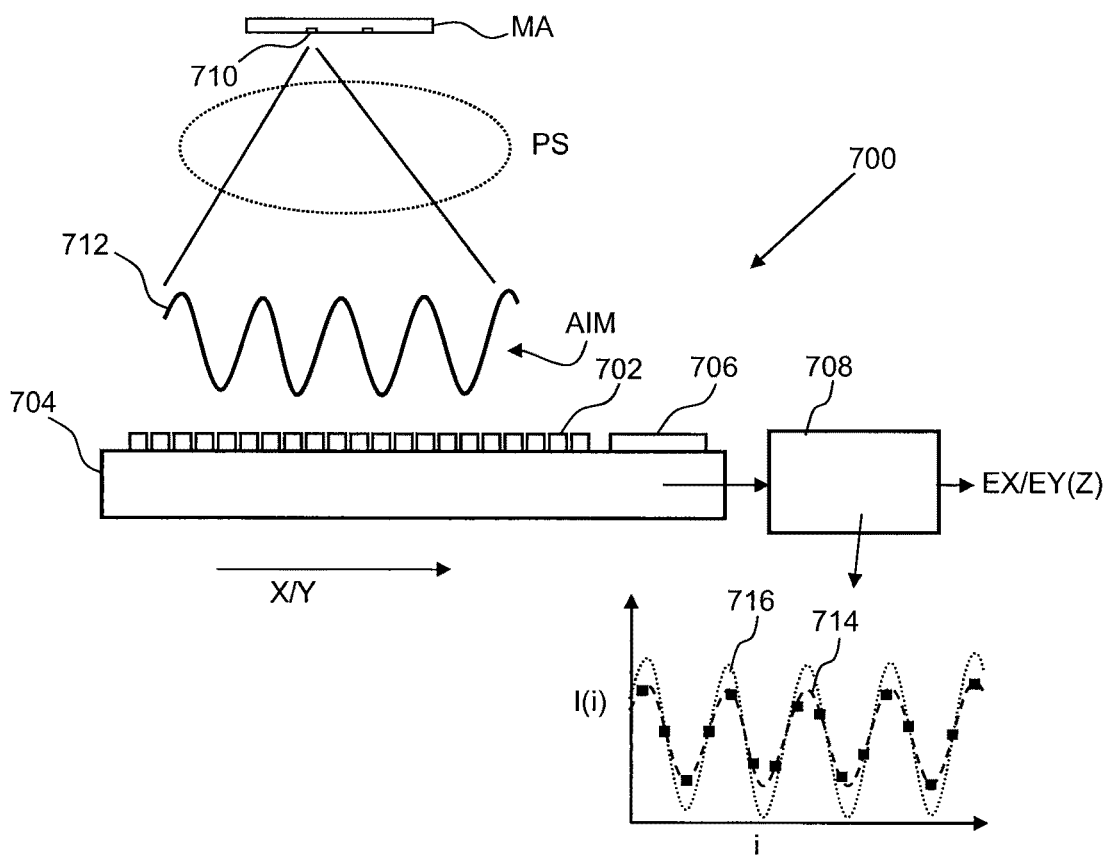
FIG. 7 illustrates the principle of operation of an image alignment sensor according to a first embodiment of the invention.

FIG. 7 illustrates the principles of operation of this novel apparatus in a first embodiment. With regard to an X/Y direction, a sensor 700 is provided, which has not a single photodetector, but an array of photodetector elements 702. These may be integrated on a substrate 704 in the same manner as known camera sensors of line or square array type. Issues such as color sensitivity need not be a priority, in a typical embodiment, while issues such as heat generation (power dissipation) may be more significant in this application than in a consumer camera device. The photodiodes are sensitive to the wavelength of radiation used in the illumination and projection system. Readout circuitry 706 may also be integrated on substrate 704, for sending individual intensity readings from the array of detector elements 702 to signal processor 708. Processor 708 incorporates schematically both the on-table processing circuitry 506 and the computer 600, as desired. In this first embodiment, processor 708 outputs a reading of the X/Y error EX/EY, as a function of the current Z position. In relation to later embodiments, it will be described how Z resolution can be incorporated in the static sensor, and those techniques may be applied in this embodiment also. Alternatively, the scanning movement in the Z direction may be performed, in the same manner as the prior art, while the sensor remains static only in the X/Y direction.

The photodiodes may be directly exposed to the environment, or may be covered by layers for optical purposes and/or physical protection. Aperture grids may be provided to define the extent of the photosensitive area more precisely, and/or to reduce crosstalk between elements.

In this first example, it is assumed that the mask alignment mark 710 features a regular grating creating a substantially sinusoidal fringe pattern in the plane of focus of a projection system PS. An intensity distribution for the aerial image AIM is indicated schematically at 712. While the photodetector elements 702 do not move, because their effective apertures are individually spaced in the X/Y direction, each inherently responds to a different portion of the intensity profile 712. In the graph at bottom right in the diagram, the vertical axis represents the intensity I(i) measured at each photodetector with index i. From the sample values plotted as small squares in the graph, and knowing that the intensity profile is sinusoidal, a curve 714 can be accurately fitted to the samples measured, and the exact position of the pattern relative to the photo diode array of sensor 700 can be calculated and output by processor 708. It is understood that, because the fringe pattern is periodic, alias positions could be reported. This can be addressed by sufficient accuracy in the prior, coarse positioning of the sensor 700. Alternative measures might include end-point detection, if the detector array is larger than the projected grating; alternatively, a finite grating has an envelope function convoluted with the sinusoid intensity pattern, which can be used for coarse position measurement As mentioned already, the simple example illustrated in FIG. 7 is adapted only for measuring the X/Y position at a single Z position. By scanning or other means such as will be described below, multiple sinusoidal curves can be plotted, for example the curve shown in dotted lines at 716. By fitting curves to the measured sample values at different Z values, whether by scanning mechanically or otherwise, a maximum amplitude of the curve can be identified, which in turn indicates the EZ=0 position. It goes without saying, if there is an offset between the effective aperture plane of the sensor 700 (or the sensor in any other embodiment) and other features on the substrate table WT and/or substrate W, they can be measured and added as an offset to the datum for accurately positioning all parts in a known relationship.

It should be noted that the sensor 700 of FIG. 7 will only yield higher resolution than known sensors if the spacing of the individual pixel detectors 702 is much smaller than the spacing of current generation gratings and image alignment sensors. Accordingly, improvements in image sensor technology may be required before the FIG. 7 embodiment becomes attractive over the other embodiments to be described. Further issues to be considered, beside those of heating and power dissipation, are the inevitable low signal to noise ratio (SNR) of small photo diodes, compared with the larger detector 402, used in the known system. These issues can be addressed by repeating measurements and integrating the results, albeit that this may affect measurement time and throughput.

Second Embodiment

Figure 8:
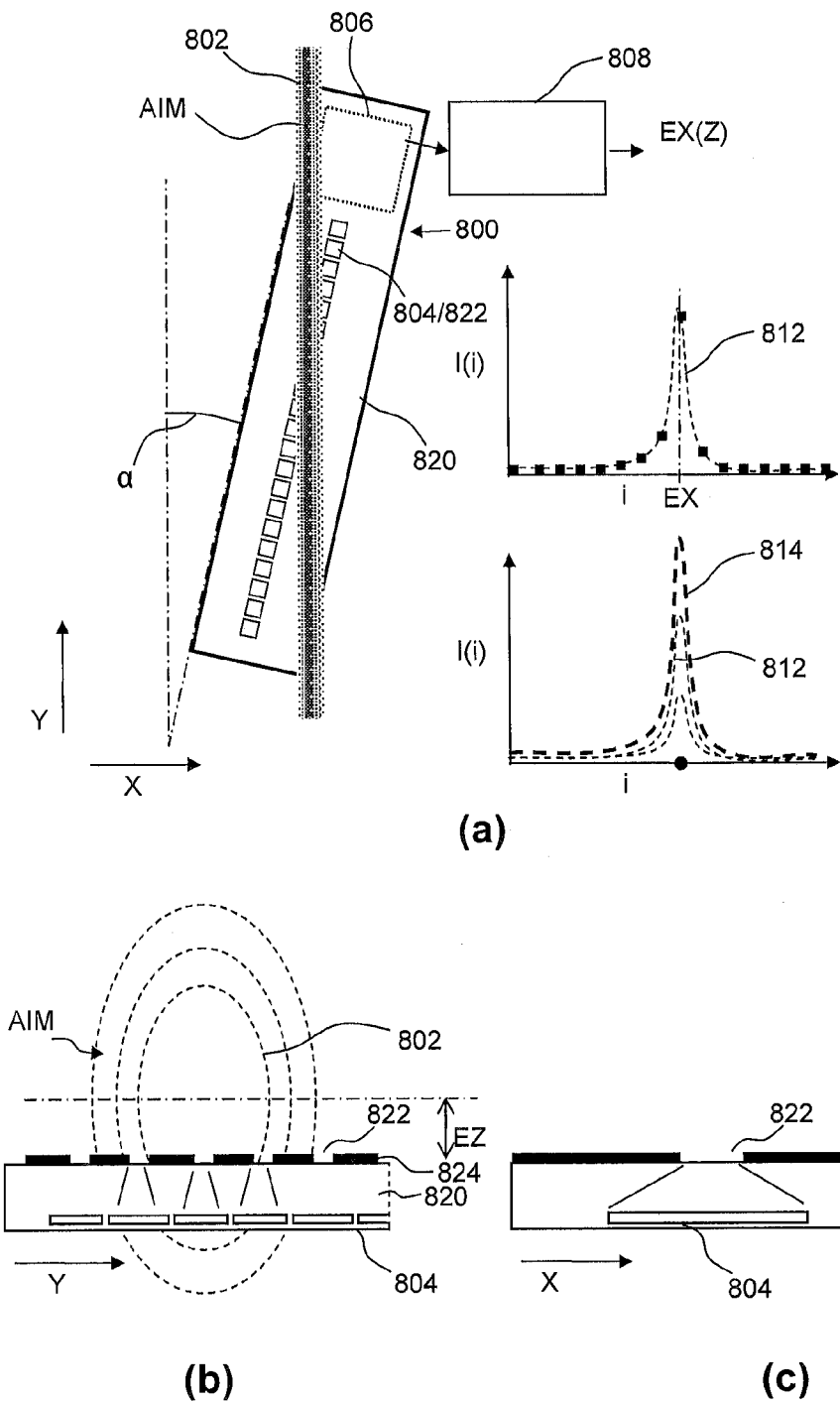
FIGS. 8, 9 and 10 illustrate various forms and principles of operation of image alignment sensors according to a second embodiment of the invention.

FIG. 8 illustrates the form and functional principles of a second embodiment of novel sensor, based on a mark which creates an aerial image AIM in the form of a discrete bright line 802, rather than a periodic grating. The bright line is illustrated in this example running parallel to the Y direction, for obtaining X position information. As in FIG. 7, a novel sensor 800 comprises a static block (typically a semiconductor substrate) on which is placed or formed a line array of individual photodetector elements 804. Readout circuitry 806 and processing circuitry 808 are provided, to obtain an EX/EY measurement for a current Z value. Rather than being arrayed transversely to the X direction, it will be seen that the array of detector elements 804 is aligned at a shallow angle α with respect to the bright line (Y) axis. Thus the line of elements 804 is effectively distributed with a very close spacing over a certain range in X direction, while being spread in a relatively larger range along the Y direction, which contains no position information in the case of the bright line 802. In this way a very fine pitch of sampling in the X direction can be obtained, with larger, more practical and less noisy detector elements 804.

The upper graph in FIG. 8(a) illustrates by dark squares the sample values for intensity that may be received from the array. In this example, rather than fitting a periodic sine curve to the measured samples, a single peak is identified and fitted, as illustrated at 812. Processor 808 identifies a peak of this curve, potentially with sub-pixel accuracy, to output the value EX on the current value of Z. As shown in the lower graph, a plurality of curves can be obtained for different Z values, either by scanning or by other means, and a maximum curve 814 selected to output both EX and EZ values for use as datum levels in subsequent measurements and the ultimate exposure process. EY is obtained similarly from another sensor (not shown) and another mark with bright lines at right angles to the line 802. Note that, once the bright line is positioned over sensor 800 within the range of the elements 804, no scanning movement is required, no vibrations are induced or positional servo errors, and therefore the accuracy of the image alignment measurement results is limited only by the properties of the sensor & processor, and the stability of its fixing on substrate table WT.

It should be understood that a practical embodiment may use a mask alignment mark providing several bright lines 802. Still, the aim in this embodiment is that these lines can be separated from each other very clearly, rather than interfering in the manner of a grating. Several sensors 800 may be provided with separate substrates, or spaced lines of detector elements 804 may be provided across a single substrate. The provision of multiple lines may improve capture range (coarse measurement speed is enhanced) and/or statistical combinations of the results from plural arrays of elements 804 may be used to improve noise rejection and accuracy in the final result. These details of implementation will be readily understood and applied by the skilled person, and will not be specifically described and illustrated in relation to this or further embodiments herein. As mentioned already, the same arrangement is repeated for measurements in the Y direction (EY).

FIGS. 8(b) and (c) show schematic cross sectional details of sensor 800 in the longitudinal (Y) direction and a transverse (X) direction, respectively. It should be noted that FIG. 8 (b) presents only a small number of elements 804 and apertures compared with the whole array illustrated in plan view. Moreover, while the X axis is indicated, the array is of course aligned with an offset axis according to angle α, and it is this offset angle which makes the aerial image 802 impinge on some apertures and detectors but not others. Therefore, in this diagram and similar diagrams to follow, the labeling "X" and "Y" should be interpreted loosely to refer to the direction X or Y plus or minus α, unless otherwise stated.

Going first to FIG. 8(b) a representation of the aerial image AIM of the bright line 802 is shown in broken elliptical lines. Individual detector elements 804 are positioned at the base of a substrate body 820, each beneath a respective aperture 822 formed in a chrome or similar opaque layer 824. Crosstalk between radiation entering one aperture 822 and radiation received by the element 804 under a neighboring aperture should be minimized. This may be done by presenting the elements 804 effectively as the aperture themselves, by positioning them much closer than illustrated behind their apertures, and/or by providing physical barriers of opaque and/or absorbent material between the elements. These measures are not shown but all are within the capability of the skilled person, and can be chosen according to their convenience, cost and relative performance.

FIG. 8(c) shows how each detector element 804 and aperture 822 may be broadened in one direction (X/Y) relative to the other (Y/X), if this will maximize sensitivity to incident radiation without degrading the accuracy of the measurement. For example, if aperture 822 is much narrower in the X direction than the brightest peak of the bright line profile 802, then accuracy will be lost through poor utilization of the incident radiation. On the other hand, if aperture 822 is wider than the peak of intensity in the radiation profile of the bright line 802, then spatial resolution will be lost, for no gain in utilization, SNR etc.

Figure 9:
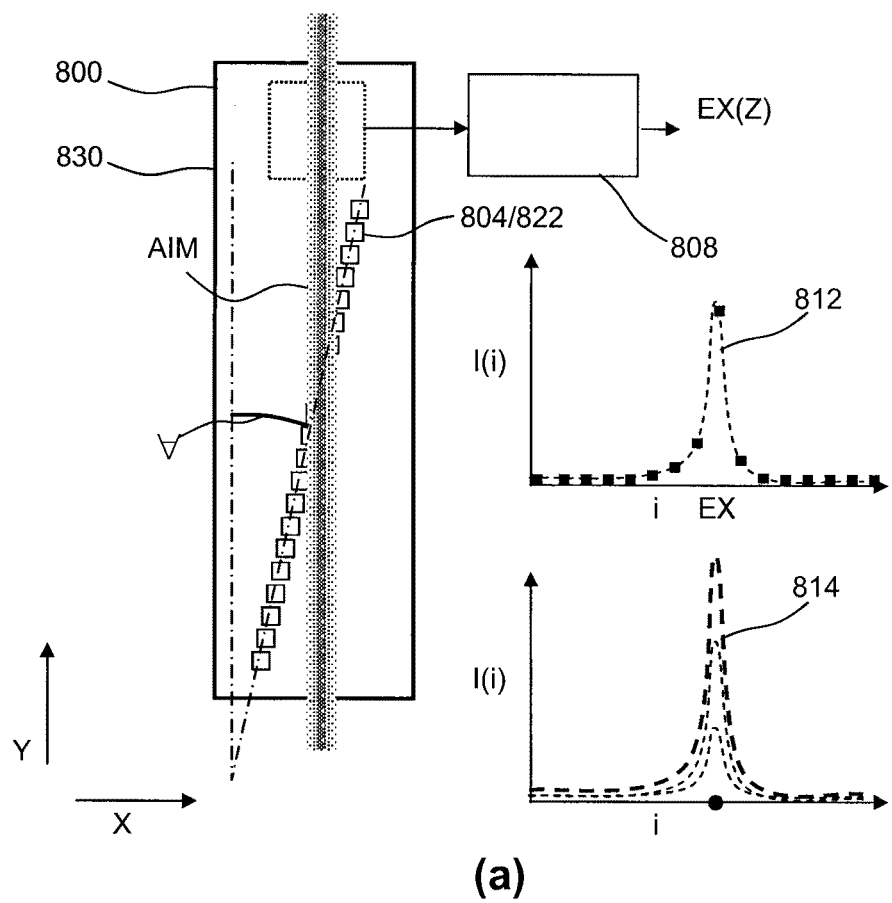
Figure 9:
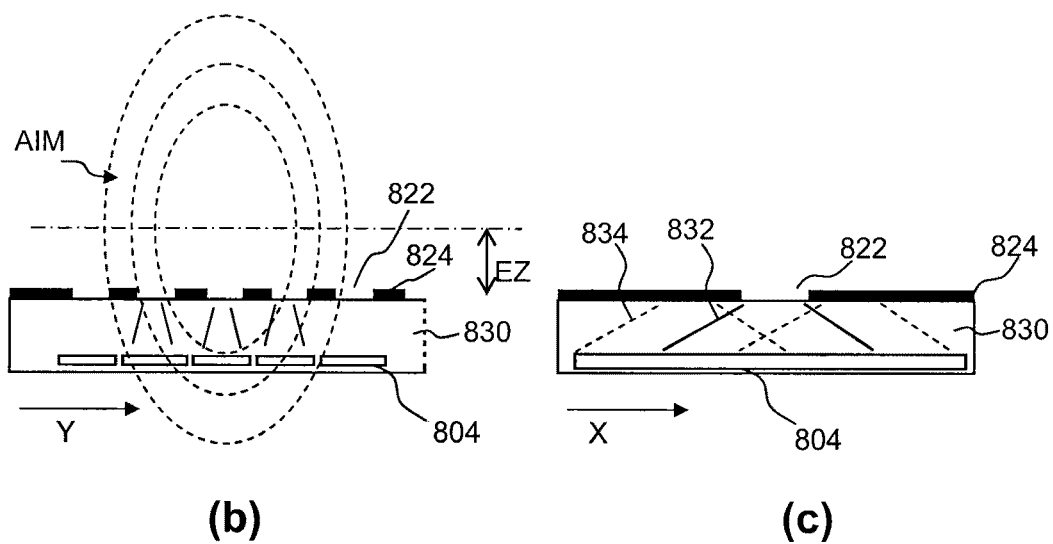

FIG. 9 shows, in a similar format to FIG. 8, a modified version of sensor 800, in which the sensor block or substrate 830 is aligned exactly with the Y axis (potentially for ease of manufacture), while the array of elements and/or apertures 804/822 is distributed obliquely across body 830 at the angle α. The signal processing and the signals obtained as illustrated by the graphs in FIG. 9(a) are identical to those in the FIG. 8 embodiment and will not be described in more detail. Some differences can be seen in that, referring to FIG. 9(b), we see again that the photodetector elements 804 while subdivided and small in the longitudinal direction (Y), are broad for maximum light utilization in the X direction. In the example shown in FIG. 9(c), body 830 carries an array of detector elements which are all uniformly placed and are of uniform width down the length of the sensor. Only the apertures 822 in the opaque layer 824 are printed/etched so as to step progressively to different X positions. A roughly central one of the apertures 822 is illustrated in this cross-section, casting a cone of radiation 832 on a central portion of a central one of the elements 804. An element nearer the beginning of the array, for example, will receive a cone of radiation 834 from an aperture (not shown in this cross-section) at an offset position, and similarly to the other side as one progresses to the other end of the array. It will be apparent that care should be taken to ensure that signals from apertures at the extremes of the array are not depressed by loss of radiation falling beyond the end of element 804. Alternatively, a correction profile may be applied to the signals read out and processed by processor 800, to compensate for any such falling off.

Figure 10:
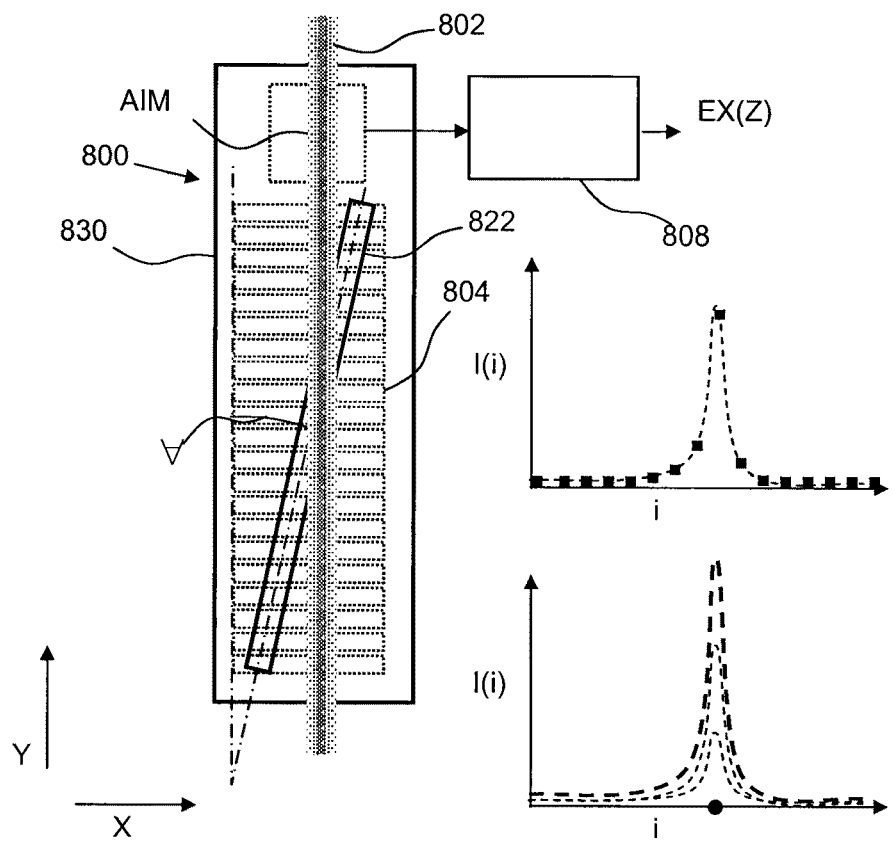
Figure 10:
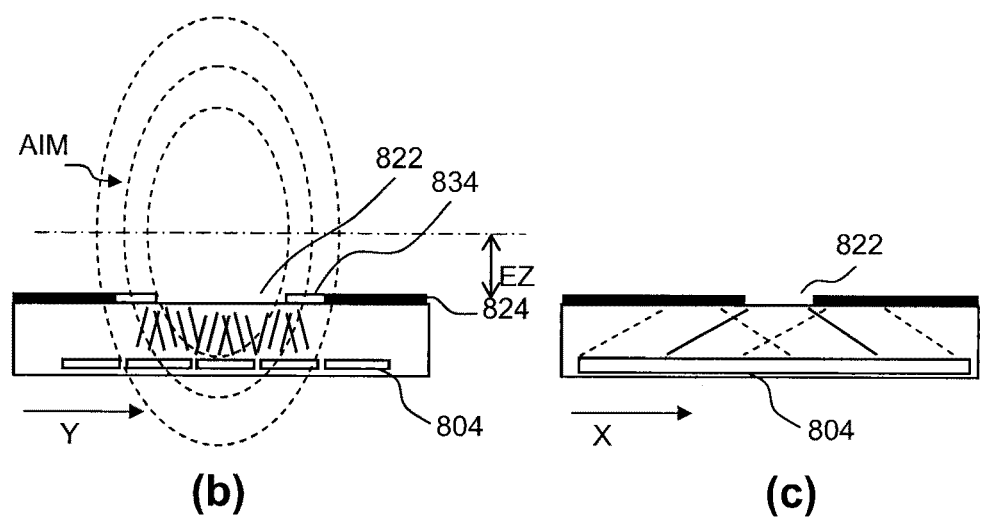

FIG. 10 illustrates a further modification similar to that of FIG. 9. Here, the same form of block 830 is used and the same processing. The only difference is that a single aperture stripe 822 is provided, running the length of the array of detector elements 804. At each point along the array, the aperture walls will have oblique portions as shown schematically at 834. Again, proximity between the opaque layer 824 which contains the apertures and the detector elements 804 may be much closer in practice than the scale shown, so that crosstalk between elements is minimized. The term 'vertical' in this context is not used in a strict sense, but is used to refer to the direction perpendicular to the substrate plane, which is usually the focus direction in a lithography system.

Static Measurement of Z Error

While the examples described so far have addressed the measurement of position with respect to the X and/or Y directions, there will now be described some modifications which allow the single, static sensor to be used for measurement, without mechanical scanning, of vertical (Z) alignment of a projected aerial image AIM. While these modifications are described in the context of the second embodiment, they may be adapted and applied equally to the first embodiment and the third embodiment (described below).

Figure 11:
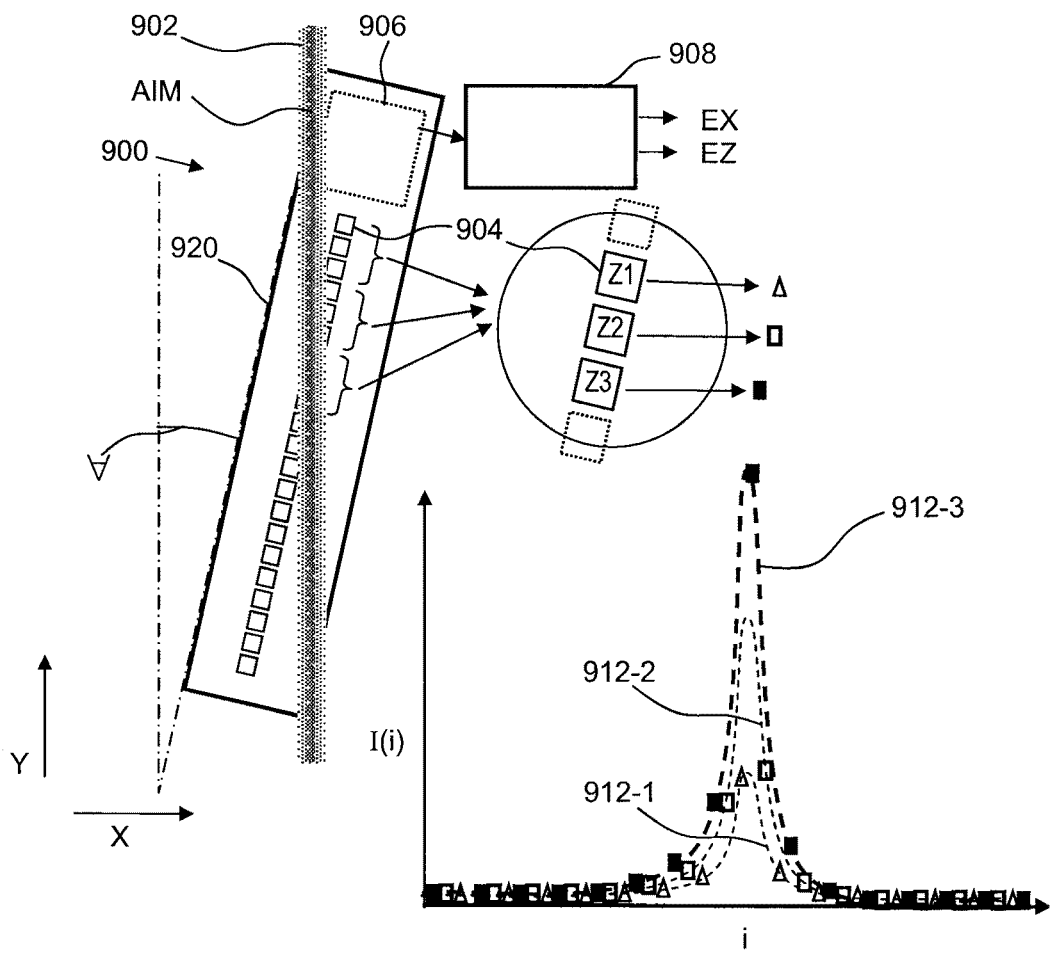
FIGS. 11 and 12 illustrate modification of the embodiments of FIGS. 8-10, to incorporate Z-direction measurement.

FIG. 11 illustrates the principle of this static measurement of Z error, based on a simple modification of the embodiment of FIG. 8. Sensor 900 comprises a body 920 carrying an array of photo detecting elements 904 and readout circuitry 906. The body 920 is mounted at an offset angle α, relative (in the case of X measurement) to the Y axis which is parallel to the bright line 902 projected by the mask alignment mark.

A modified signal processor 908 receives the individual pixel data from readout circuitry 906, and processes the data to generate not only an EX value, but also an EZ value. For this purpose, as shown in the inset detail, the pixels (photodetector elements 904) are assigned to different depth values Z1, Z2, Z3 in a fixed sequence (or in a known randomized sequence). The manner of achieving a different depth value per pixel is something which can be done in several ways, as described further below. The number of different depth values provided may be greater or less than three. For the time being, it should just be understood that, rather than fitting a single intensity curve to the sample values received from photo detecting elements 904, processor 908 uses the association between each pixel and the depth value Z1, Z2, Z3 to treat these as three separate data sets, symbolized by the triangle, the open rectangle and the black rectangle, as plotted in the graph at the foot of FIG. 11.

Fitting curves of the expected shape to each of the three sample sets reveals three intensity/sample position profiles, labeled 912-1, 912-2 and 912-3. As indicated, these curves correspond respectively to the Z1, Z2, Z3 depth values. As curve 912-3 is the highest in peak intensity, a value EZ corresponding to Z3 can be output, as well as a value X corresponding to the X position of the peak of the fitted curve. Provided that the curve shape is known and fitted to a number of samples, sub-pixel resolution can be obtained. It will be appreciated that, in providing for resolution between only three values, Z1, Z2 and Z3 in the Z direction, resolution in the X direction has been divided by three, at least in each data set. Having said that, on the assumption that the intensity distribution in the aerial image 902 is not tilted but is symmetrical about a plane perpendicular to the X axis, X information from the weaker curves 912-1 and 912-2 can be combined with that from the strongest curve 912-3 to improve accuracy of the X position. Moreover, although not plotted against the Z direction, curves can be fitted also between the heights of the peaks and resolution finer than the steps Z1, Z2, Z3 can be obtained in the Z dimension also.

Noting that the highest peak corresponds to Z3, which is an extreme rather than a middle one of the Z values available, one should appreciate that better certainty in the Z value will be obtained if samples are obtained from either side of the peak value. In a practical embodiment, there may be more than three levels of Z. In any event, the measurement shown can be used as a coarse result, and the substrate table WT and sensor 900 can be moved to a slightly different level, and fixed there while a measurement in which peak 912-2 (for depth Z2) is the highest of the three is performed. Again, because the method does not involve mechanical scanning during measurement (at least at the fine result stage), accuracy is improved. Speed may be improved also.

Figure 12:
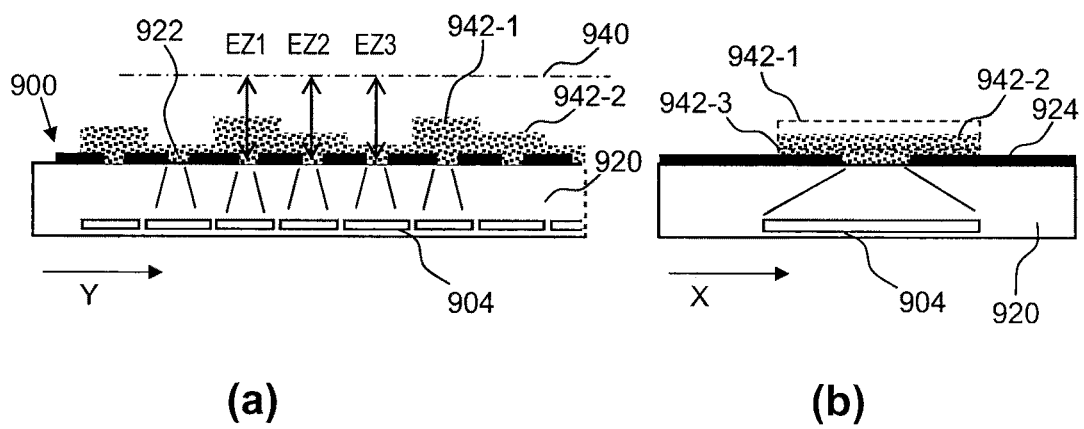

FIG. 12 illustrates one technique for obtaining parallel measurements for different Z values, without moving sensor 900. As in the earlier drawings, FIG. 12(a) shows a longitudinal cross section of a part of the sensor, while FIG. 12(b) shows a transverse cross section. As before, some form of body 920 is provided, which houses individual photodetector elements 904, beneath apertures 922 in an opaque layer 924. The modification which places each pixel effectively at a different Z value is to vary the optical path length between neighboring apertures and a datum line 940, by the insertion of differing thicknesses of material having another refractive index than the environment. Where the refractive index is n, the optical path length in a real distance dz is n.dz. Naturally, the optical path length and refractive index have to be calculated with respect to the actual wavelength of radiation used, and the refractive index of any immersion medium (water) that may be present in place of air or vacuum.

The different step heights are shown in FIG. 12 (a), side by side, while FIG. 12 (b) represents a small cross section through a step 942-2 at the height corresponding to level Z2. Other step heights are shown in broken lines as 942-1 and 942-3.

Figure 13:
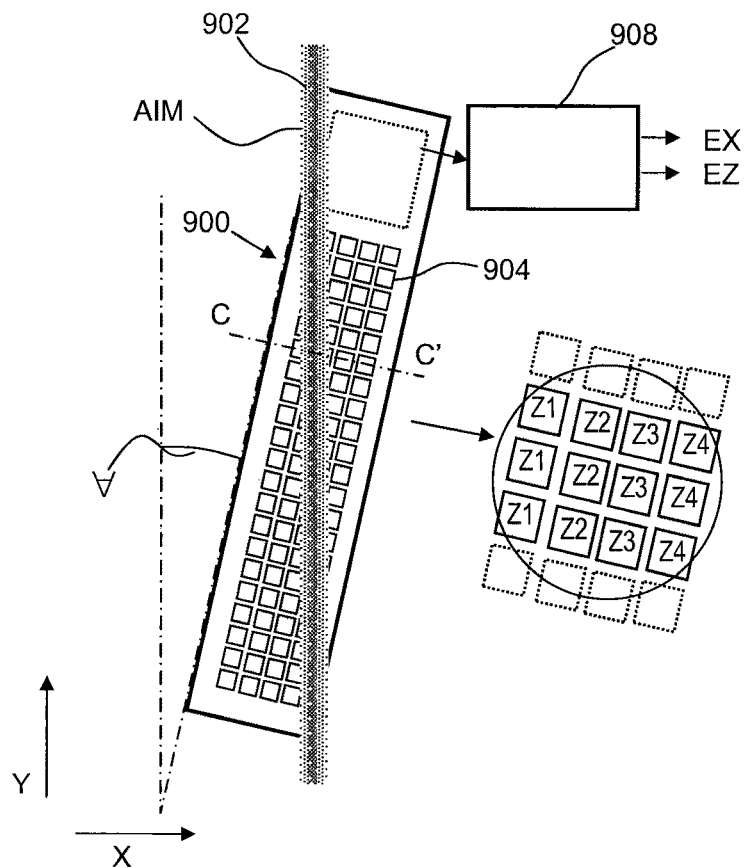
FIG. 13 illustrates a second example of a sensor incorporating Z-direction measurement.
Figure 13:
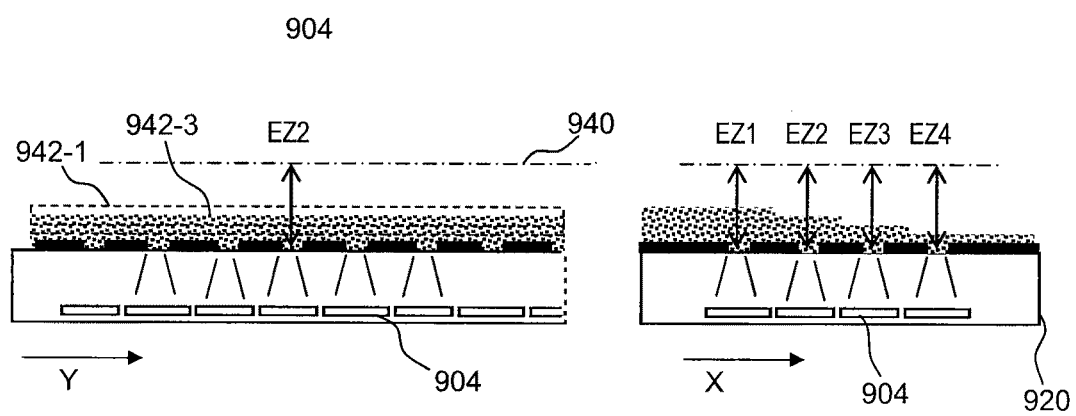

FIG. 13 shows a modified sensor 900 with several lines of photodetectors 904. Each line in this case has its own Z value, for example four lines at depths Z1-Z4. The processing to obtain results EX and EZ is simply a version of the processing described with respect to FIG. 11, adapted for the fact that the apertures/detectors for each Z value are displaced by a known amount to one another, particularly in the X direction. Therefore a specific offset in the X direction may be applied to the result from each different line of pixels. The EX value can be used from the line having the strongest intensity, or one can combine them all, with their individual offsets, to arrive at an agreed accurate EX value.

FIGS. 13(b) and (c) show the implementation of the four Z values across the sensor 900, according to which the "staircase" of refractive material thickness is not repeated cyclically along the length of the sensor, but rather is constant along the length, and progresses in four steps from line to line of pixels, along the line C-C'. FIG. 13(c) shows also that the detector elements 904 are now sub-divided in the transverse direction, as well as in the longitudinal direction. In both embodiments (FIG. 12, FIG. 13), issues concerning the management of crosstalk, resolution, light capture etc apply, as they did in examples of FIGS. 8-10.

Figure 14:
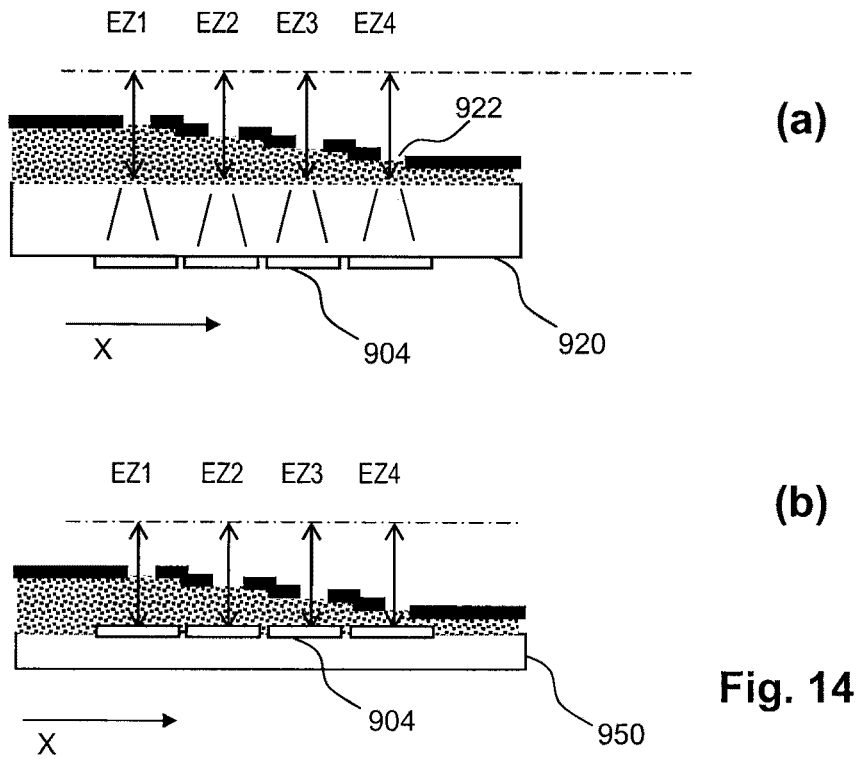
FIG. 14 illustrates two variations on the structure of the sensor for use in embodiments of the invention.

FIG. 14 shows a couple of alternative approaches to the creation of the "staircase" in the Z direction. In both FIGS. 14(a) and (b) the opaque layer creating the apertures 922 is applied on top of the step refractive material, instead of below it. FIG. 14(b) also shows an example in which detector elements 904 are on top of a substrate body 950, rather than spaced through a body material at a distance from the apertures and refractive material.

The refractive material may comprise etched glass as one example, or it may comprise silicon dioxide, such as may be integrated on top of a photodetector, by normal semiconductor processing. Many variations and permutations of the measures described can be applied, all with the aim of imparting different optical path lengths from one pixel to another. Instead of a staircase structure, particularly in the FIG. 13 example it may be more practical to create a sloping wedge profile. If the angle of the wedge is such as to effectively displace the beams by a prism effect, this can be compensated by an offset in the signal processing to obtain true X values. Rather than a wedge of refractive material, it would be possible alternatively to mount the detector array at a pre-arranged Z tilt (known as RX, for rotation about the X axis, or RY for rotation about the Y axis). This will inherently place the apertures at different heights relative to the plane of the substrate table WT without special refractive material.

Instead of varying the thickness of the material, a constant thickness of materials having different refractive indices could be applied. Different materials may be deposited separately, or the refractive index of a single layer may be modified by doping different portions. These various approaches can even be combined to achieve the desired variation in optical path length.

Figure 15:
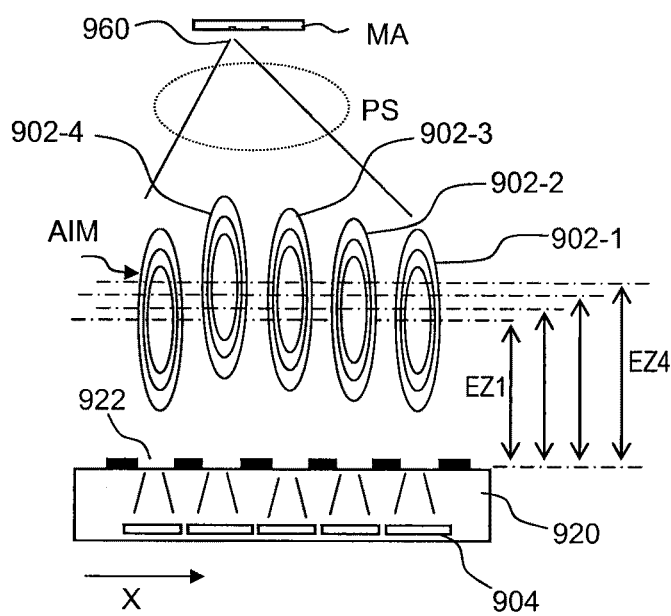
FIG. 15 illustrates an alternative embodiment in which Z-direction measurement is implemented by a modified patterning device rather than a modified sensor.

FIG. 15 shows a further way to impart different effective Z values to neighboring pixels in the array of elements 904 in a detector body 920 which is neither tilted nor provided with steps or wedges of refractive material. In this example, the mask alignment mark M1, M2 etc. is modified as at 960, to include the steps or wedge of varying Z height. This can be achieved by applying or etching away a certain depth of glass or other refractive material, or of variably doped materials and the like, as described above. The result of this is that adjacent bright lines in the aerial image AIM are focused at slightly different heights, labeled 902-1 (Z1), 902-2 (Z2), 902-3 (Z3) and 902-4 (Z4) in the diagram. Accordingly, when the apertures 922 of different lines of detector elements 904 are presented to the aerial image at a level somewhere among the Z levels of the aerial images of the bright lines, information on the relative magnitudes of four Z error values EZ1-EZ4 can be obtained, and a curve fitted to identify the Z error EZ from a single static measurement step. Naturally the need for a specially processed reticle makes this embodiment less convenient for optical lithography applications.

Third Embodiment

Figure 16:
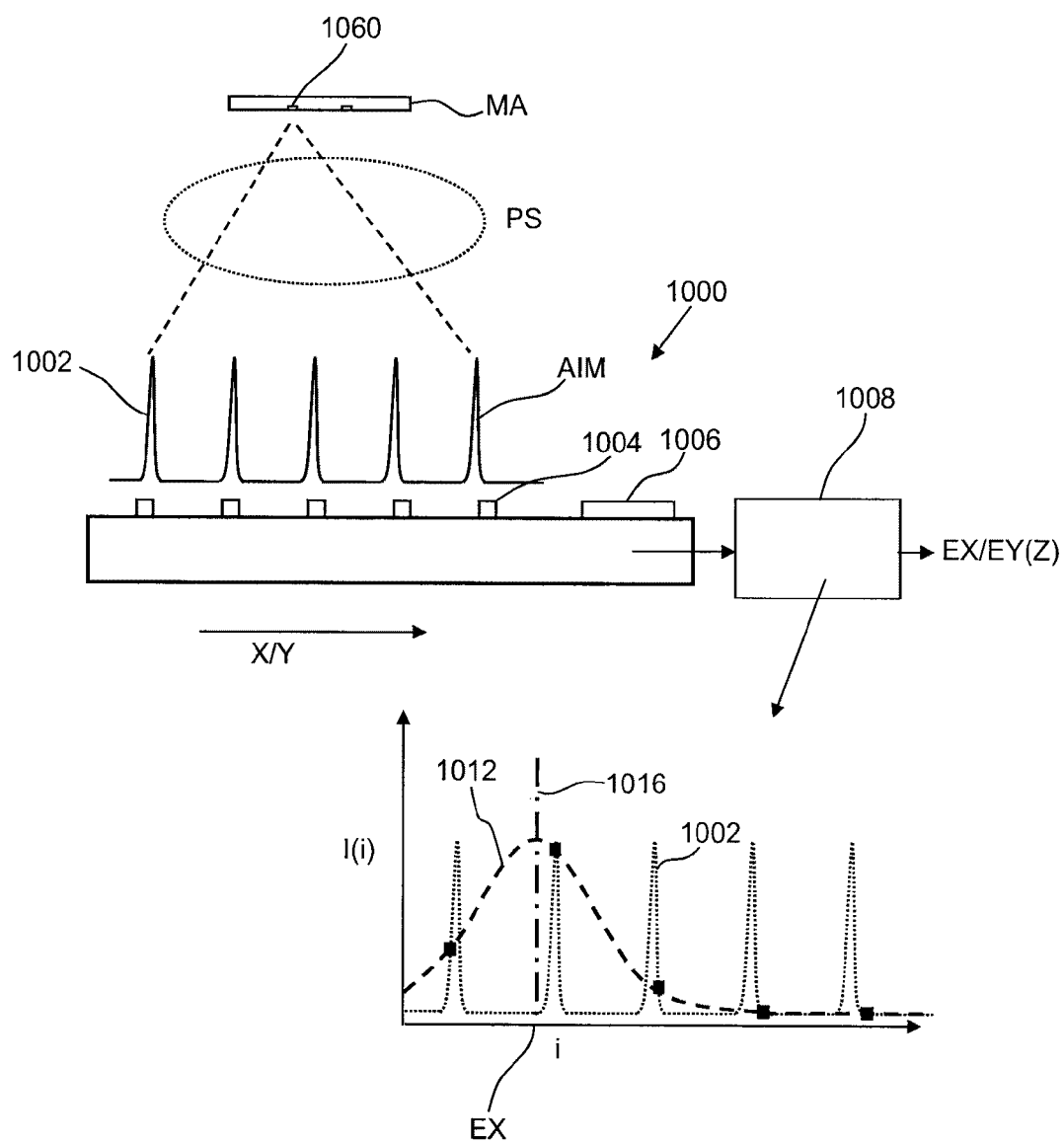
FIG. 16 illustrates the structure and principle of image alignment mark and image alignment sensor in accordance with a third embodiment of the invention.

FIG. 16 shows a third type of embodiment in which a sensor 1000 includes relatively sparsely placed detector elements 1004. Readout circuitry 1006 and processor 1008 are provided, as in previous embodiments. Each detector element may comprise a line to collect a good quantity of light. Each element may be behind an aperture, or the nature of the detector itself may define an effective aperture of the appropriate size and shape. Viewed in only the X/Y direction, it can be seen that the elements 1004 are relatively sparsely placed. In the orthogonal direction (into the page) they may be a continuous line, or a line of discrete detector elements 1004. In the simple example illustrated, Z information is not obtained directly, but the principles of providing for different Z path lengths to different detectors can be applied in this embodiment equally as they are in the embodiments of FIGS. 11-15. The elements 1004 may be sub-divided in the orthogonal direction for this purpose.

The mask alignment mark 1060 in this case is arranged to deliver, through projection system PS, a series of bright lines, represented by spikes in the intensity profile 1002 representing the intensity of the aerial image AIM. The spatial period of these bright lines is close to but slightly different from the spacing of the detector elements 1004, so that only one element at a time can receive the full intensity of a bright line. This vernier-like arrangement yields sample values such as are illustrated in the graph at the foot of FIG. 16, from which a curve 1012 can be inferred, and a value for EX/EY can be derived from the centre line 1016 of that curve.

Variants & Applications

Figure 17:
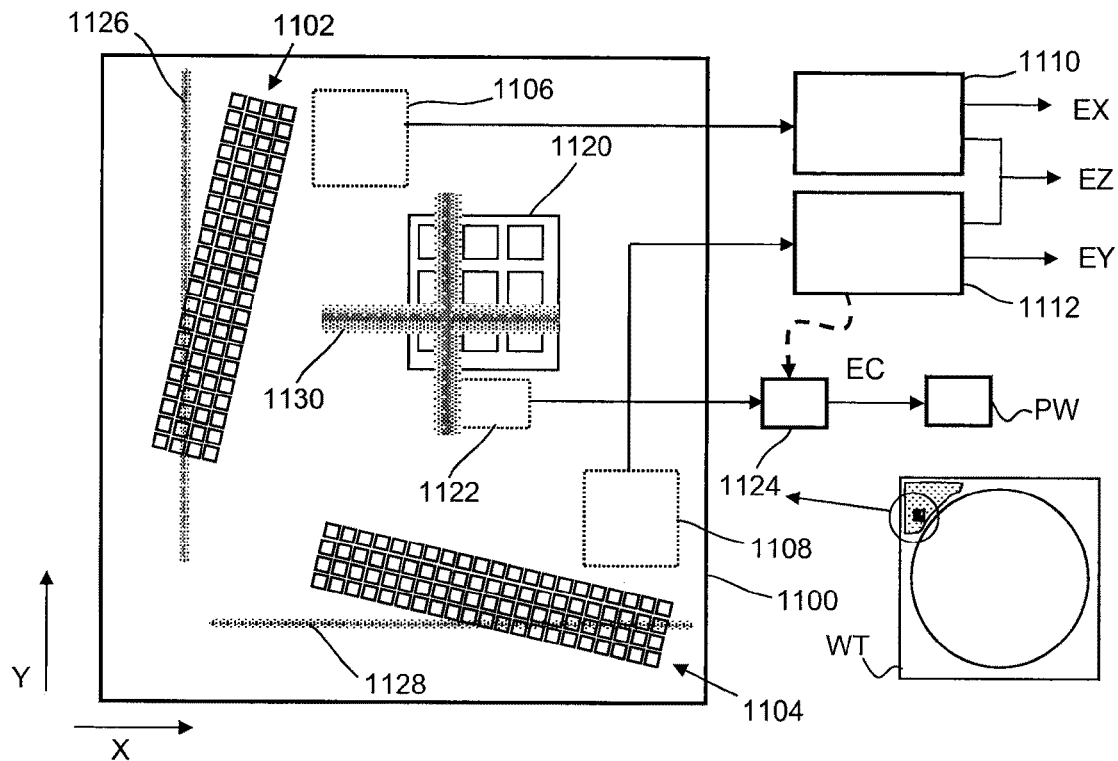
FIG. 17 illustrates the provision of sensors for different axes in one sensor block.

As mentioned already, the various features of the embodiments described above can be applied in X and Y directions, independently or in a combined form. FIG. 17 illustrates a sensor block 1100 which contains two fine arrays of photo-detecting elements forming a sensor 1102 for X-direction information and a sensor 1104 for Y-direction position information. Each of these sensors is illustrated with the form similar to the example of FIG. 13, but could equally be a sensor of the form illustrated in any of the embodiments from FIG. 8 to FIG. 16. Readout circuitry 1106, 1108 provides signals to processors 1110 and 1112. Each sensor 1102, 1104 also includes Z-direction resolving capability, and the processors 1110 and 1112 together provide Z-position information (EZ). Readout circuitry 1106, 1108 and/or processors 1110 and 1112 need not be provided separately for the X- and Y-directions, but could be combined as desired.

Also on sensor block 1100 is a coarse alignment sensor 1120, with its own readout circuitry 1122 and processor 1124. Processor 1124 outputs coarse error signals EC, with X, Y and Z components, which are used by the substrate table positioning system PW to bring the fine sensors 1102, 1104 into alignment with the mask alignment features, in this case bright lines 1126, 1128. For this purpose, the projected mask alignment pattern also includes coarse alignment features, such as the cross feature 1130. As can be seen, once the cross feature 1130 is aligned centrally on the coarse alignment sensor 1120, the bright lines 1126 and 1128 will be centered on their respective X and Y sensors 1102, 1104, and further movement of the substrate table is not necessary to obtain the fine readings EX, EY, EZ. Additionally or alternatively, corrections to the coarse position can be triggered by signals from the fine position processors 1122, 1124, as indicated by the dashed arrow.

Trade-offs exist in the accuracy achievable between all these variants, in terms of the complexity of processing, and the compactness and cost of the sensors. While bright lines are described as alignment features, dark lines on a bright field could in principle also be used.

The fine measurement photodetectors may be integrated also with coarse positioning photodetectors, arranged to respond to the same projected features over a wider range of EX, EY and/or EZ or to additional features. Photodetectors for coarse positioning may be entirely separate from those used for fine positioning, or may be shared. Where a line of detectors is arranged at a shallow angle α for the fine measurement, a line of broader detectors can be arranged at a greater angle for coarse capture and measurement, still without scanning movements.

Figure 18:
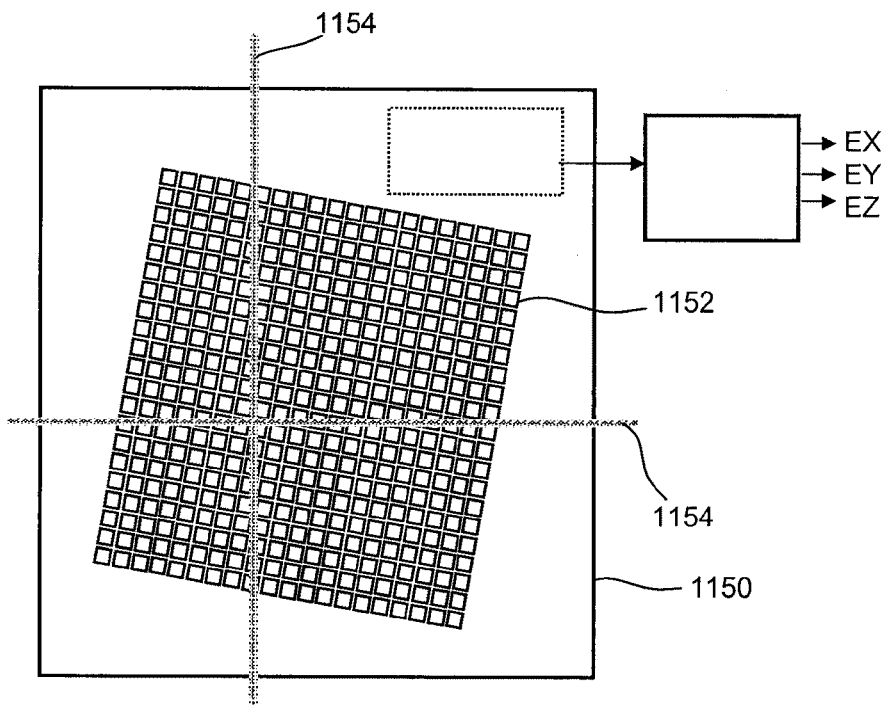
FIG. 18 illustrates a combined multi-axis sensor.

FIG. 18 illustrates a further alternative sensor block 1150 in which a sensor 1152 comprises a unified, 2-dimensional array of photo-detector elements. For this example, a two-dimensional mask alignment pattern 1154 is generated, for example crossed lines rather than simple parallel lines, and the single detector array can resolve both X and Y information by appropriate processing. Given a sufficiently fine pixel pitch, the array could be squarely aligned with the X, Y grid, similar to the example of FIG. 7. For reasons given above, however, setting the array at an angle relaxes the sensor pitch requirement and simplifies signal processing.

Many other forms of mark and coarse positioning systems can be envisaged, and the example illustrated is in no way intended to be limiting. The example is also not intended to be to scale. For practical reasons, sensor block 1100 is likely to be much larger in extent than the sensors 1102, 1104 within it. This is particularly the case where coarse alignment sensors and other sensors are mounted in the same module. The extent of the entire alignment pattern may be on the order of a millimeter or a few millimeters. Feature sizes and spacings in the alignment pattern itself may be of the order of a micron or a few microns. The spatial resolution achieved by curve fitting, averaging and other techniques can be finer than the feature size, and finer than the wavelength of radiation employed. The feature size may be smaller still, in the case of an EUV or imprint apparatus having naturally tighter positioning requirements.

The skilled person will appreciate that aperture, as used throughout this section, can mean both a single line (that is a single rectangular transmission function) as well as a more complex line pattern (that is a more complex localized transmission function, which on average resembles a rectangular transmission function).

In an embodiment, sensors such as sensor 700, 800, 900, 1000, 1100 and 1150 are provided at two, three or four positions on the substrate table WT, so as to read two or more of the mask alignment marks M1-M4 simultaneously. While X and Y may be measured simultaneously, the invention can give a speed and accuracy advantage, even in embodiments where EX, EY and EZ are measured, sequentially or two at a time.

While certain embodiments measure different Z values simultaneously using different pixels interleaved in a repetitive pattern or in parallel lines, more complex interleaving patterns are possible, whether in one-dimensional or two-dimensional arrays. Another option for varying the optical path length between samples would be a moving refractive element such as a segmented wheel or other moving part. This would need to be designed so as not to disturb the X and Y measurements, however, if they are to made strictly simultaneously. The Z variations can be measured at a separate time, however, and the benefit of not using the substrate table or mask table motors for scanning in Z would be retained.

While direct projection between alignment mark and the sensor is illustrated and described in the embodiments that follow, modifications are envisaged in which for some reason the projection of the alignment mark is reflected at one or other of the substrate support and the patterning device or its support, and the sensor and alignment mark are both at the same side of the projecting optical system.

These and many other variations can be envisaged by the skilled reader, based on the present disclosure.

Figure 19:
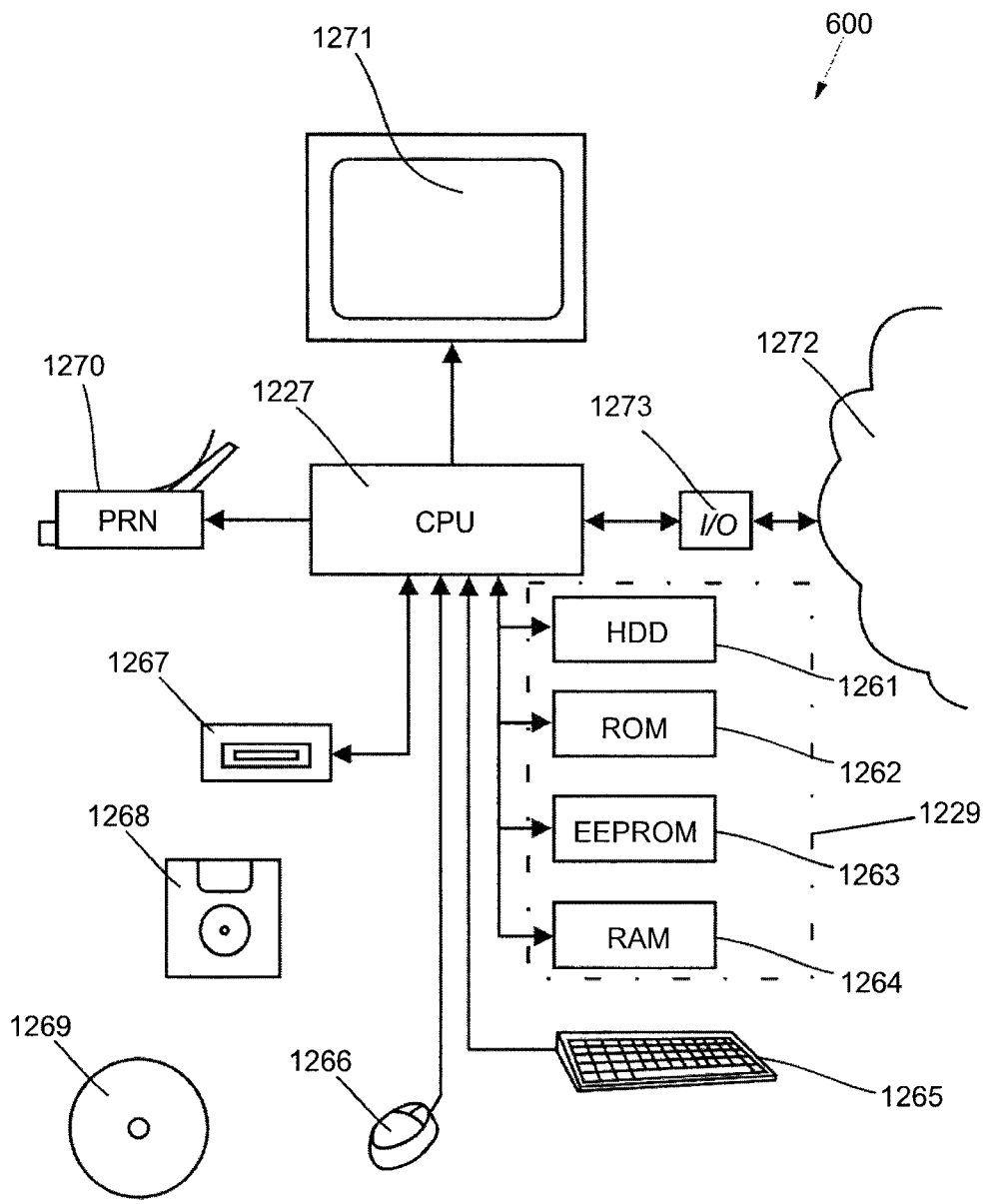
FIG. 19 illustrates computer system hardware useful in implementing the measurement and exposure processes of FIGS. 4 to 16.

It should be understood that the processing unit 600 in the previous embodiments may be a computer assembly as shown in FIG. 19. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the image alignment sensors 700, 800 etc.

Memory 1229 connected to processor 1227 may comprise a number of memory components like a hard disk 1261, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by way of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272.

It is observed that, although all connections in FIG. 19 are shown as physical connections, one or more of these connections can be made wireless. They are only intended to show that "connected" units are arranged to communicate with one another in some way. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured. For imprint lithography, there is no projection system required to transfer the product pattern itself from the patterning device to the substrate. Nevertheless, optical systems can be employed to project an alignment pattern from the patterning device to image alignment sensors of the type described herein. The invention is not limited to optical lithography. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention, or features within the invention, may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus arranged to transfer a pattern from a patterning device onto a substrate, the apparatus comprising:
 a patterning subsystem for receiving said patterning device and applying said pattern to the substrate held at a patterning location;
 a substrate support for holding the substrate while said pattern is applied;
 at least one positioning subsystem for moving said substrate support relative to said patterning subsystem and said patterning device such that said pattern is applied at an accurately known location on the substrate; and
 a measuring subsystem for measuring the location of said substrate relative to the patterning location, and for supplying measurement results to said positioning subsystem,
 wherein said measuring subsystem includes at least one sensor for receiving radiation projected from an alignment mark, the sensor and the alignment mark being associated one with the patterning device and the other with the substrate support, and a processor for receiving and processing signals from the sensor to resolve spatial information in the projected alignment mark to establish a reference position for measuring positional relationships between said substrate support and said patterning location, wherein said sensor comprises an array of photodetector elements separated in at least one dimension and arranged in a line, the line being oriented at a non-zero angle to the orientation of a line in the projected alignment mark such that the sensor and the processor are operable to perform at least a final step in establishing the reference position while holding the substrate support and patterning device stationary with respect to one another and the processor calculating from signals of said array a reference position in a dimension perpendicular to the line in the projected alignment mark.

2. An apparatus as claimed in claim 1 wherein the processor is configured and arranged to calculate from signals of said array the position in said first dimension of the projected alignment mark which comprises features having a slightly different spacing in said first dimension.

3. An apparatus as claimed in claim 1 wherein said sensor is associated with said substrate support, while the alignment mark is associated with the patterning device.

4. An apparatus as claimed in claim 1 wherein said sensor is operable to measure reference positions in three dimensions simultaneously while the substrate support is held stationary.

5. A lithographic apparatus as in claim 1, wherein each of the photodetector elements of the array of photodetector elements is configured and arranged to detect a respective spatially separated portion of a spatial distribution of intensity of the received radiation from the alignment mark, and the sensor and the processor are operable to perform said final step in establishing the reference position on the basis of the detected spatial distribution of intensity.

6. A device manufacturing method comprising transferring a pattern from a patterning device onto a substrate, the method comprising:
 providing a patterning subsystem for receiving said patterning device and applying said pattern to a portion of said substrate held at a patterning location;
 holding the substrate on a substrate support;
 measuring the location of said substrate relative to the patterning location;
 operating said patterning subsystem while using results of said measuring step to position said substrate support relative to said patterning subsystem and said patterning device in a sequence of movements such that said pattern is applied at a desired portion of the substrate; and
 processing said substrate to create product features in accordance with the applied pattern,
 wherein said measuring step includes a preliminary step of (i) receiving radiation projected from an alignment mark using a sensor which comprises an array of photodetecting elements separated in at least one dimension and arranged in a line, the line being oriented at a non-zero angle to the orientation of a line in the projected alignment mark and (ii) processing signals from the sensor to resolve spatial information in the projected alignment mark to establish a reference position for measuring positional relationships between said substrate support and said patterning location in at least said one dimension, such that the sensor and the processor perform at least a final step in establishing the said reference position while the substrate support and patterning device are held stationary with respect to one another and the processor calculating from signals of said array a reference position in a dimension perpendicular to the line in the projected alignment mark.

7. A method as claimed in claim 6 wherein at least two sensors are provided for measuring reference positions respectively in two orthogonal directions generally parallel to a substrate plane, one or both of said sensors additionally providing measurement in a third dimension parallel to an optical axis of the projection system.

8. A method as claimed in claim 6 wherein for the performance of said preliminary step said sensor is associated with said substrate support, while the alignment mark is associated with the patterning device.

9. A method as claimed in claim 8 wherein, given compatible alignment marks on the pattering device, said sensor(s) are operable in the preliminary step to measure reference positions in three dimensions simultaneously while the substrate table and patterning device are held stationary relative to one another.

10. A non-transitory machine readable medium containing one or more sequences of machine-readable instructions for controlling a lithographic apparatus, the instructions being adapted for controlling the measurement and positioning steps of a method as claimed in claim 6, and further to cause one or more programmable processors of the apparatus to process signals from the sensor to resolve spatial information in the projected alignment mark to establish a reference for measuring positional relationships between said substrate support and said patterning location in at least one dimension, at least a final step in establishing the said reference position being performed while the substrate support is held stationary.

11. A non-transitory machine readable medium as in claim 10, wherein each of the photodetector elements of the array of photodetecting elements is configured and arranged to detect a respective spatially separated portion of a spatial distribution of intensity of the received radiation from the alignment mark, and the processing signals from the sensor to resolve spatial information comprises using the spatial distribution of intensity of the received radiation.

12. A device manufacturing method as in claim 6, wherein each of the photodetector elements of the array of photodetecting elements is configured and arranged to detect a respective spatially separated portion of a spatial distribution of intensity of the received radiation from the alignment mark, and the processing signals from the sensor to resolve spatial information comprises using the spatial distribution of intensity of the received radiation.

13. A lithographic apparatus arranged to transfer a pattern from a patterning device onto a substrate, the apparatus comprising:
   a patterning subsystem for receiving said patterning device and applying said pattern to the substrate held at a patterning location;
   a substrate support for holding the substrate while said pattern is applied;
   at least one positioning subsystem for moving said substrate support relative to said patterning subsystem and said patterning device such that said pattern is applied at an accurately known location on the substrate; and
   a measuring subsystem for measuring the location of said substrate relative to the patterning location, and for supplying measurement results to said positioning subsystem,
   wherein said measuring subsystem includes at least one sensor for receiving radiation projected from an alignment mark, the sensor and the alignment mark being associated one with the patterning device and the other with the substrate support, and a processor for receiving and processing signals from the sensor to resolve spatial information in the projected alignment mark to establish a reference for measuring positional relationships between said substrate support and said patterning location, wherein said sensor comprises an array of photodetector elements separated in at least one dimension such that the sensor and the processor are operable to perform at least a final step in establishing the reference position while holding the substrate support and patterning device stationary with respect to one another wherein the processor is arranged to distinguish between the different photodetector elements in accordance with respectively different optical path lengths from the alignment mark, thereby to calculate a reference position in a dimension (Z) parallel to an optical axis of a projection system of the lithographic apparatus.

14. An apparatus as claimed in claim 13 wherein the sensor is constructed and/or mounted so as to impart the optical path length differences between the photodetector elements.

15. An apparatus as claimed in claim 14 wherein the optical path length differences between the photodetector elements are imparted by varying one or both of the thickness and refractive index of material placed in front of the elements.

16. An apparatus as claimed in claim 13, wherein at least two groups of photodetector elements are provided for measuring reference positions respectively in two orthogonal directions generally parallel to a substrate plane, one or both of said groups additionally providing measurement in a third dimension parallel to the optical axis of the projection system.

* * * * *

UNITED STATES PATENT AND TRADEMARK OFFICE
CERTIFICATE OF CORRECTION

PATENT NO. : 8,773,637 B2  Page 1 of 1
APPLICATION NO. : 12/908564
DATED : July 8, 2014
INVENTOR(S) : Marcus Adrianus Van De Kerkhof et al.

It is certified that error appears in the above-identified patent and that said Letters Patent is hereby corrected as shown below:

On title page, item (75) Inventors, Line 5
replace "Hasselt (PT)"
with --Hasselt (BE)--.

Signed and Sealed this
Fourteenth Day of October, 2014

Michelle K. Lee
*Deputy Director of the United States Patent and Trademark Office*